(12) United States Patent
Choi et al.

(10) Patent No.: US 7,772,598 B2
(45) Date of Patent: Aug. 10, 2010

(54) DISPLAY DEVICE AND MANUFACTURING METHOD THEREFOR

(75) Inventors: Tae-young Choi, Gyeonggi-do (KR); Keun-kyu Song, Gyeonggi-do (KR); Seung-hwan Cho, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 135 days.

(21) Appl. No.: 11/698,439

(22) Filed: Jan. 26, 2007

(65) Prior Publication Data

US 2007/0170431 A1    Jul. 26, 2007

(30) Foreign Application Priority Data

Jan. 26, 2006   (KR) .................. 10-2006-0008295

(51) Int. Cl.
*H01L 27/15* (2006.01)
(52) U.S. Cl. .............. 257/84; 257/184; 257/187; 257/257; 257/E31.053
(58) Field of Classification Search .......... 257/84, 257/184, 187, 257; 349/47
See application file for complete search history.

(56) References Cited

U.S. PATENT DOCUMENTS 5,614,427 A * 3/1997 den Boer et al. .......... 438/30

| | | | |
|---|---|---|---|
| 2002/0145144 A1 * | 10/2002 | Kane et al. | 257/72 |
| 2006/0054884 A1 * | 3/2006 | Maeda et al. | 257/40 |
| 2006/0086933 A1 * | 4/2006 | Iechi et al. | 257/40 |
| 2006/0131669 A1 * | 6/2006 | Albagli et al. | 257/401 |

FOREIGN PATENT DOCUMENTS

| | | |
|---|---|---|
| JP | 08-160469 | 6/1996 |
| JP | 2003-222906 | 8/2003 |
| JP | 2004048036 A | 2/2004 |
| JP | 2005175248 A | 6/2005 |
| KR | 1020010098473 | 11/2001 |

OTHER PUBLICATIONS

English Language Abstract, JP Patent First Publication No. 2003-222906, Aug. 3, 2003, 1 page.
English Language Abstract, KR Patent First Publication No. 1020010098473, Nov. 8, 2001, 1 page.
English Language Abstract, JP Patent First Publication No. 08-160469, Jun. 21, 1996, 1 page.

* cited by examiner

*Primary Examiner*—Wai-Sing Louie
(74) *Attorney, Agent, or Firm*—Innovation Counsel LLP (57) ABSTRACT

A display device, comprising an insulating substrate; a data conductor formed on the insulating substrate and comprising a conductive film; a thin film transistor having at least one source electrode electrically connected with the conductive film, and a drain electrode formed along a circumference of the source electrode and spaced therefrom; and a pixel electrode which is electrically connected with the conductive film.

15 Claims, 10 Drawing Sheets

DISPLAY DEVICE AND MANUFACTURING METHOD THEREFOR

CROSS-REFERENCE TO RELATED APPLICATIONS

This application claims the benefit of Korean Patent Application No. 2006-0008295, filed on Jan. 26, 2006, in the Korean Intellectual Property Office, the disclosure of which is incorporated herein by reference.

1. Field of the Invention

The present invention relates to a display device and a manufacturing method thereof and, more particularly, to a display device having an improved thin film transistor.

2. Description of the Related Art

Flat panel display devices such as LCDs commonly comprise a liquid crystal display panel that includes a substrate having a thin film transistor; a color filter substrate having a color filter; and a liquid crystal layer interposed between the thin film transistor substrate and the color filter substrate. The thin film transistor (TFT) comprises a gate electrode; a source electrode and a drain electrode which are divided by a gate electrode. A semiconductor layer is formed on an intermediate area of the source electrode and the drain electrode that defines a channel area. When the channel area is wide and its length is short, a greater on-current value results and improves the performance of the thin film transistor.

A conventional channel area has a straight or J shape, and is partially open so that the width W and length L of the channel area may not be maximized.

SUMMARY OF THE INVENTION

In accordance with an aspect of the present invention a display device having an improved thin film transistor comprises an insulating substrate; a conductive thin film and a data line formed on the insulating substrate; a thin film transistor having at least one source electrode electrically connected with the conductive film, a drain electrode formed along a circumference of the source electrode and spaced therefrom to define a channel area having an organic semiconductor layer formed thereon, and a pixel electrode.

According to another aspect of the present invention, a wall surrounds the channel area having the semiconductor layer within.

According to another aspect of the present invention, the display device further comprises a gate line insulatingly crosses the data line defining a pixel region, a gate electrode branches from the gate line and is disposed on the organic semiconductor layer.

According to another aspect of the present invention, the source electrode, the drain electrode and the pixel electrode are formed of indium tin oxide (ITO) or indium zinc oxide (IZO).

According to another aspect of the present invention, an intermediate insulating film is interposed between the conductive film and the source electrode and between the conductive film and the drain electrode, the intermediate insulating film having a source contact hole connecting the source electrode and the conductive film and a pixel contact hole connecting the pixel electrode and the conductive film. Advantageously, the dielectric constant of the intermediate insulating film lies in the range of from 1 to 5.

According to another aspect of the present invention, the drain electrode has a circular, oval or polygonal loop shape, and the source electrode is located as an island within but separated from the drain electrode.

According to another aspect of the present invention, the conductive film blocks light from the channel area.

The foregoing and/or other aspects of the present invention can be achieved by providing a display device, comprising an insulating substrate; a data wire which is formed on the insulating substrate; a drain electrode which is electrically connected with the data wire; a source electrode which is spaced from the drain electrode and has an island shape surrounded by the drain electrode; a conductive film which is electrically connected with the source electrode; and a pixel electrode which is electrically connected with the conductive film.

According to another aspect of the present invention, the drain electrode is provided as a plurality of closed hooks, and the source electrode is provided within each of the drain electrodes.

According to another aspect of the present invention, the conductive film is simultaneously formed with the data wire, and covers an intermediate area between the drain electrode and the source electrode.

The foregoing and/or other aspects of the present invention can be achieved by providing a method of manufacturing a display device, comprising forming a data wire having a conductive film on an insulating substrate; forming an intermediate insulating film having a source contact hole, a drain contact hole and a pixel contact hole in the data wire; forming at least one source electrode which is formed on the intermediate insulating film and connected with the conductive film through the source contact hole, a drain electrode which is formed along a circumference of the source electrode to be spaced therefrom, and a pixel electrode which is connected with the conductive film through the pixel contact hole.

According to another aspect of the present invention, the source electrode and the drain electrode are formed after forming a metal layer on the intermediate insulating film and patterning the metal layer; and the pixel electrode is formed after forming an electrode material layer of indium tin oxide (ITO) or indium zinc oxide (IZO) on the intermediate insulating film and patterning the electrode material layer.

BRIEF DESCRIPTION OF THE DRAWING

The above and/or other aspects and advantages of the present invention will become apparent and more readily appreciated from the following description of the embodiments, taken in conjunction with the accompany drawings, in which:

FIGS. 3a through 6b illustrate a manufacturing method of the thin film transistor substrate according to the present invention.

DETAILED DESCRIPTION OF EMBODIMENTS

Figure 1:
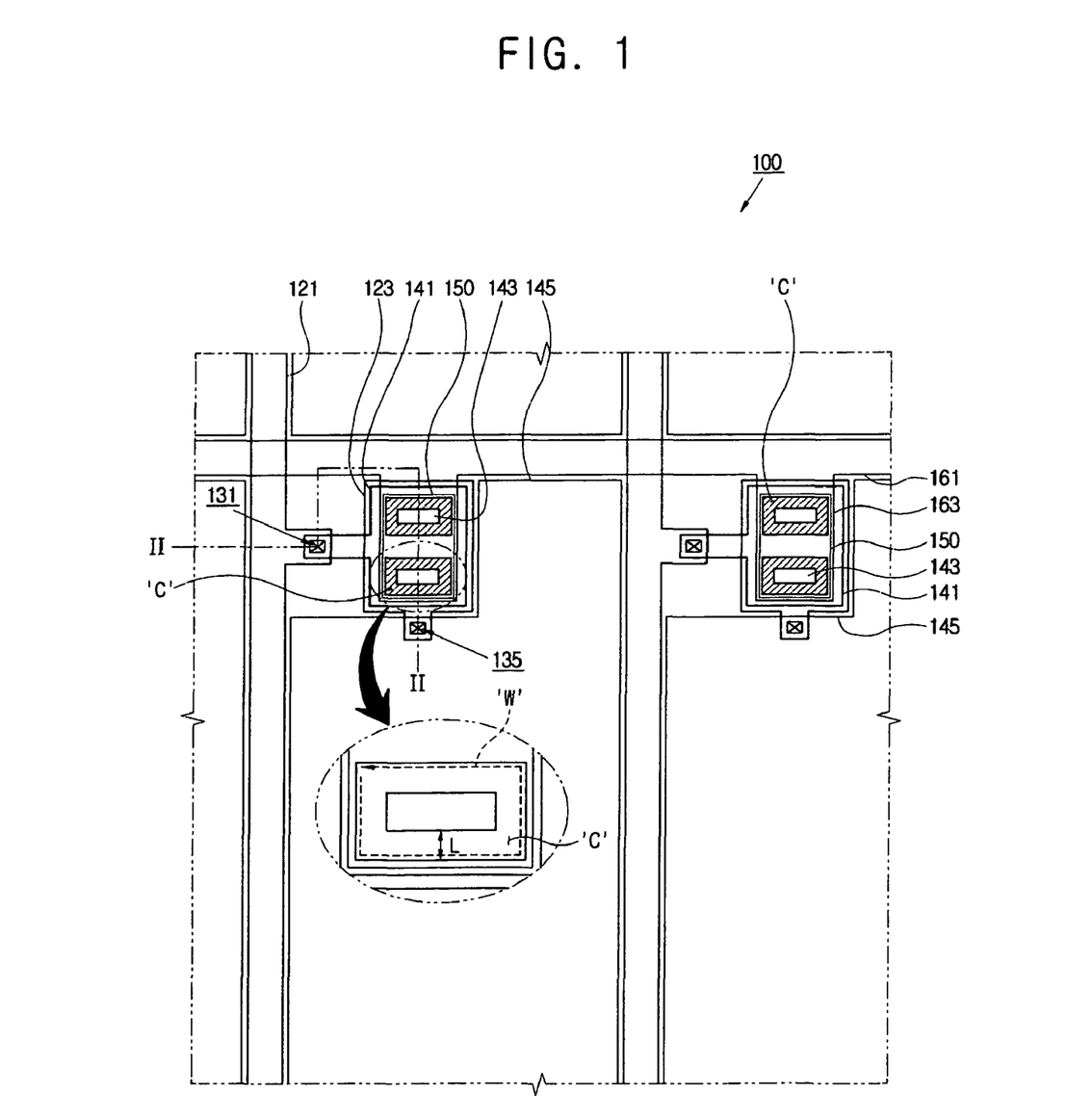
FIG. 1 illustrates a thin film transistor substrate of a display panel according to the present invention.
Figure 2:
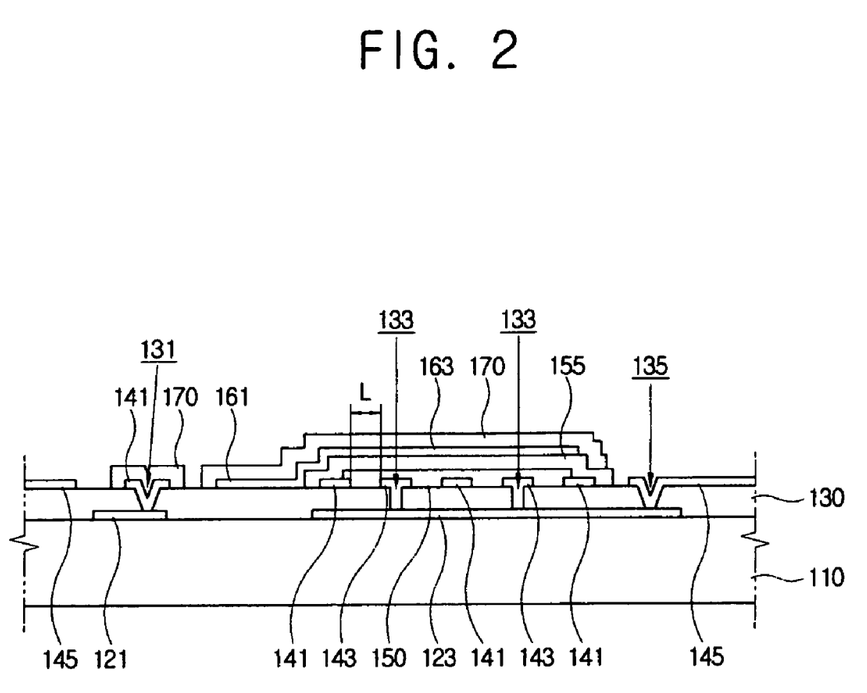
FIG. 2 is a sectional view of the thin film transistor substrate according to the present invention, taken along line II-II in FIG. 1.

Referring to FIGS. 1 and 2, a thin film transistor substrate 100 of a display device according to the present invention comprises an insulating substrate 110; data conductors (121 and 123) which are formed on insulating substrate 110 and have a data line 121 extended in a predetermined direction and a conductive film 1 23 separated from data line 121; an intermediate insulating film 130 which covers data conductors 121 and 123; a drain electrode 141, a source electrode 143 and a pixel electrode 145 formed on intermediate insulating film 130; an organic semiconductor layer 150 which is formed between drain electrode 141 and source electrode 143; and gate conductors (161 and 163) which have a gate line 161 perpendicular to data line 121 and a gate electrode 163 branched from gate line 161 and formed on organic semiconductor layer 150.

Insulating substrate 110 may comprise glass or plastics. When insulating substrate 110 comprises a plastic, the display device may be flexible but has poor heat resistance. However, according to the present invention a plastic substrate can be used since an organic semiconductor layer 150 may be formed at a normal temperature and pressure. Suitable exemplary plastic materials comprise polycarbonate, polyimide, PES, PAR, PEN, PET, or the like.

Data conductors 121 and 123 are formed on insulating substrate 110 and comprise data line 121 formed on substrate 110 in a predetermined direction, a data pad (not shown) which is formed on an end part of data line 121 and receives a driving or control signal from the outside, and conductive film 123 which corresponds to the gate electrode 163 (to be described later). Conductive film 123 may comprise a light blocking film which covers organic semiconductor layer 150. The data pad receives the driving or control signal from the outside and transmits the signal to data line 121. The conductive film 123 blocks light from organic semiconductor layer 150 and provides connection to source electrode 143 and pixel electrode 145. Data conductors 121 and 123 may comprise at least one of Al, Cr, Mo, Nd, Au, Pt, Pd, ITO and IZO which are cost-effective and highly thermal conductive. Data conductors 121 and 123 may comprise a single layer or a plurality of layers which has at least one of the foregoing materials.

In the embodiment of the present invention, data conductors 121 and 123 are first formed, and then intermediate insulating film 130 is formed on data conductors 121 and 123. Layer 130 protects organic semiconductor layer 150 from the chemicals used for forming data conductors 121 and 123.

A drain contact hole 131, a source contact hole 133 and a pixel contact hole 135 are made in intermediate insulating film 130 to connect data line 121 and drain electrode 141, to connect source electrode 143 and conductive film 123, and to connect the pixel electrode 145 and conductive film 123, respectively. Intermediate insulating film 130 formed on conductive film 123 prevents conductive film 123 from being converted into a floating electrode and also planarized the conductive film. Conductive film 123 may be connected with source electrode 143 to function as source electrode 143, thereby possibly forming a parasitic capacitance C between the gate electrode 163 and the conductive film 123 that may lower the performance of the thin film transistor. To minimize the parasitic capacitance problem, intermediate insulating film 130 according to the present invention has low dielectric constant, illustratively in the range of 1 to 5.

Intermediate insulating film 130 according to the present invention should have good light transmittance and be stable when subjected to following processes. Intermediate insulating film 130 may comprise an organic film having, for example, BCB, an acrylic photosensitive film or a double layer having organic and inorganic films. When intermediate insulating film 130 is double layered, the inorganic film may comprise silicon nitride (SiNx) with hundreds of Å thickness, preventing impurities from being introduced to the organic semiconductor layer.

Drain electrode 141, source electrode 143 and the pixel electrode 145 are formed on intermediate insulating film 130. Drain electrode 141 is connected with data line 121 through the drain contact hole 131, and surrounds source electrode 143. More specifically, drain electrode 141 is spaced from source electrode 143 and formed along a circumference of source electrode 143. Drain electrode 141 is shaped like a closed loop. For example, drain electrode 141 may have circular, polygonal, or elliptical shape, etc. One or more source electrodes 143 are formed as islands within drain electrode 141. When source electrode 143 is plurally provided, drain electrode 141 surrounds each of the source electrodes 143. As shown in FIG. 1, two drain electrodes 141 which are shaped like a rectangular loop, are connected with each other. Source electrode 143 is disposed within the two drain electrodes 141. Source electrode 143 is electrically connected with conductive film 123 through source contact hole 133.

An intermediate area between drain electrode 141 and source electrode 143 defines a channel area C. The distance between drain electrode 141 and source electrode 143 is the effective length L of channel area C while the four internal sides of drain electrode 141 corresponding to source electrode 143 are the effective width W of channel area C. Channel area C surrounds source electrode 143 and is shaped like a closed loop and may have a circular, polygonal or oval shape, etc.

Generally, the on-current of the thin film transistor is proportional to the width W/length L of the channel area C. In the thin film transistor according to the present invention, source electrode 143 is surrounded by drain electrode 141 and thus the width W of the channel area C is increased compared to that of the conventional channel area C having a straight or J shape. As the on-current value of the thin film transistor increases, the thin film transistor provides better performance. With the foregoing configuration, source electrode 143 is smaller than in the prior art, thereby reducing parasitic capacitance between gate electrode 163 and source electrode 143 resulting in better the thin film transistor performance.

Pixel electrode 145 is electrically connected with conductive film 123 through the pixel contact hole 135 and forms a part of a pixel region defined by data line 121 and gate line 161. Pixel electrode 145 receives a control or video signal from source electrode 143 through conductive film 123.

Drain electrode 141, source electrode 143 and pixel electrode 145 are comprised of a transparent conductive material such as indium tin oxide (ITO) or indium zinc oxide (IZO). Drain electrode 141 and source electrode 143 according to another embodiment of the present invention may comprise at least one of Al, Cr, Mo, Au, Pt, Pd, Cu and AlNd having a high work function. The pixel electrode 145 may comprise ITO or IZO.

Meanwhile, a wall (not shown) which exposes at least a part of the channel area C, drain electrode 141 and source electrode 143, may be formed on intermediate insulating film 130. When organic semiconductor layer 150 is formed using an inkjet method, the wall allows an organic semiconductor solution to be provided in the channel area C.

Organic semiconductor layer 150 is formed on the channel area C. Organic semiconductor layer 150 covers source electrode 143 and drain electrode 141 which are exposed. Organic semiconductor layer 150 may comprise a derivative having a substituent such as tetracene or pentacene, or oligothiopene with 4 or 8 of which are connected through the 2 and 5 positions of thiopene ring. Organic semiconductor layer 150 may comprise perylenetetracarboxlic dianhidride (PTCDA) or an imide derivative thereof, or naphthalenetetracarboxlic dianhydride (NTCDA) or an imide derivative thereof. Organic semiconductor layer 150 may comprise metalized pthalocyanine or a halogenized derivative thereof, or perylene or coroene and a derivative having a substituent thereof. Preferably, copper, cobalt and zinc may be added to the metalized pthalocyanine. Organic semiconductor layer 150 may comprise co-oligomer or co-polymer of thienylene and vinylene, or thienylene or coroene and a derivative comprising a substituent thereof, or a derivative comprising an aromatic or heteroaromatic ring of the derivatives and one or more hydrocarbon chains having 1 to 30 carbon atoms.

Organic semiconductor layer 150 according to another embodiment of the present invention may comprise amorphous silicon or poly silicon.

A gate insulating film 155 which comprises an organic material is formed on organic semiconductor layer 150. When organic semiconductor layer 150 directly contacts the gate electrode 163 or when an organic insulating film is disposed therebetween, organic semiconductor layer 150 may deteriorate. The gate insulating film 155 prevents organic semiconductor layer 150 from directly contacting the gate electrode 163, and allows organic semiconductor layer 150 to maintain its performance. The gate insulating film 155 may comprise a single layer having an organic film, or a double layer having both organic and inorganic films.

The gate wires 161 and 163 are formed on the gate insulating film 155. The gate wires 161 and 163 comprise gate line 161 which is perpendicular to data line 121 and defines the pixel region; the gate pad (not shown) which is provided on the end part of gate line 161 and receives a driving or control signal from the outside; and the gate electrode 163 which is branched from the gate line 141 and corresponds to organic semiconductor layer 150 (to be described later). The gate pad receives the driving and control signals from the outside to turn on/off the thin film transistor, and transmits the signals to the gate electrode 163 through gate line 161. The gate wires 161 and 163 may comprise at least one of Al, Cr, Mo, Nd, Au, Pt and Pd, and may be provided as a single or a plurality of layers, like data conductors 121 and 123.

A passivation film 170 is formed on the gate wires 161 and 163 and drain electrode 141 that is exposed to the outside. The passivation film 170 may comprise an acrylic photosensitive organic film or a film having silicon nitride, thereby preventing defects due to the exposure of the gate wires 161 and 163, and drain electrode 141.

Hereinafter, a manufacturing method of the display device according to the present invention will be described with reference to FIGS. 3a through 6b. FIGS. 3a through 6b are plan views and sectional views of manufacturing the thin film transistor substrate 100 according to the present invention.

Figure 3A:
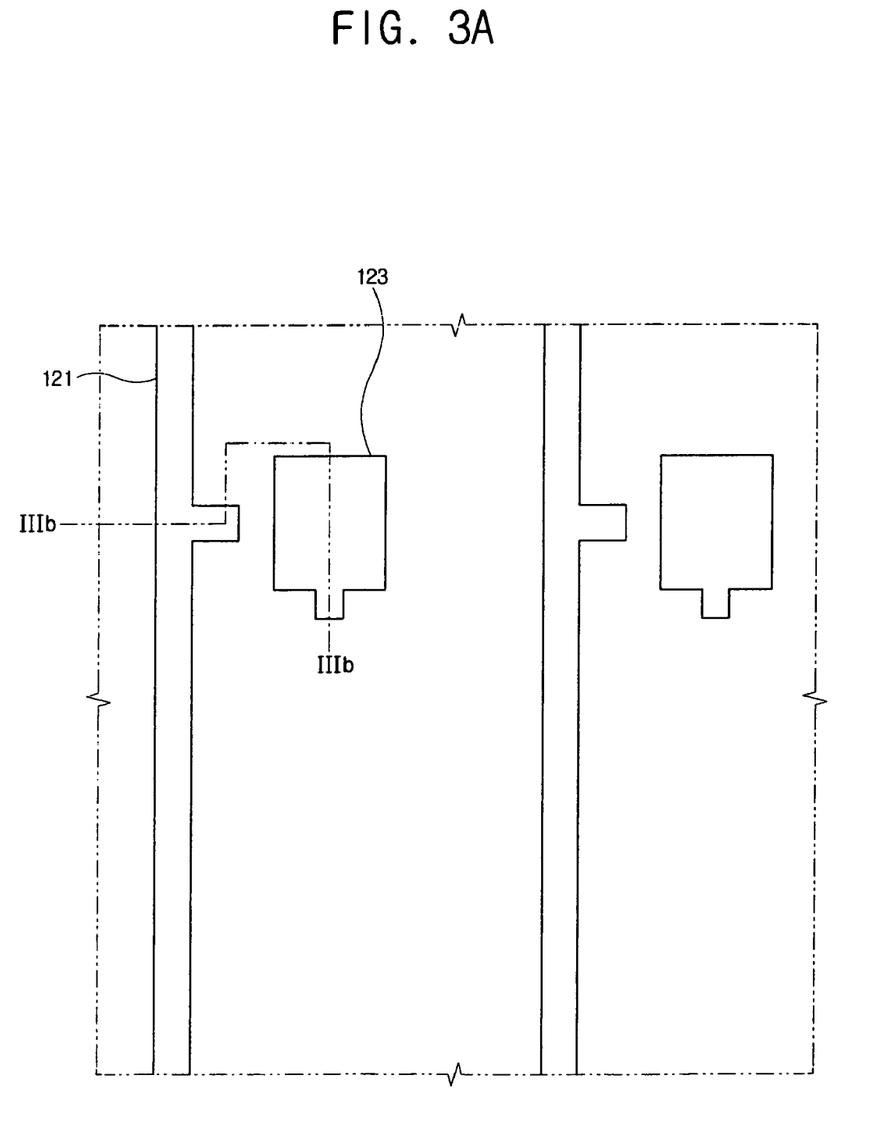
Figure 3B:
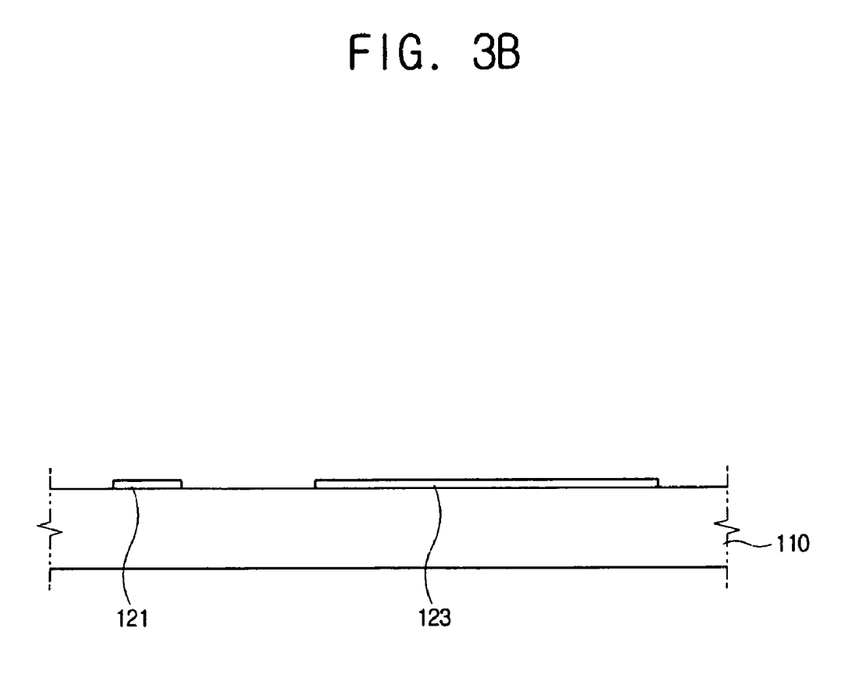

As shown in FIGS. 3a and 3b, data conductor material is applied to insulating substrate 110 to form the data conductor material layer. Then, the data conductor material layer is patterned to form data line 121, the data pad (not shown) and the conductive film 123. Insulating substrate 110 may comprise glass, silicon or plastic. The data conductor material layer having at least one of Al, Cr, Mo, Nd, Au, Pt and Pd is deposited on insulating substrate 110 through a sputtering method and then through photolithography, to form the data wire 121, the data pad (not shown) and the conductive film 123.

Figure 4A:
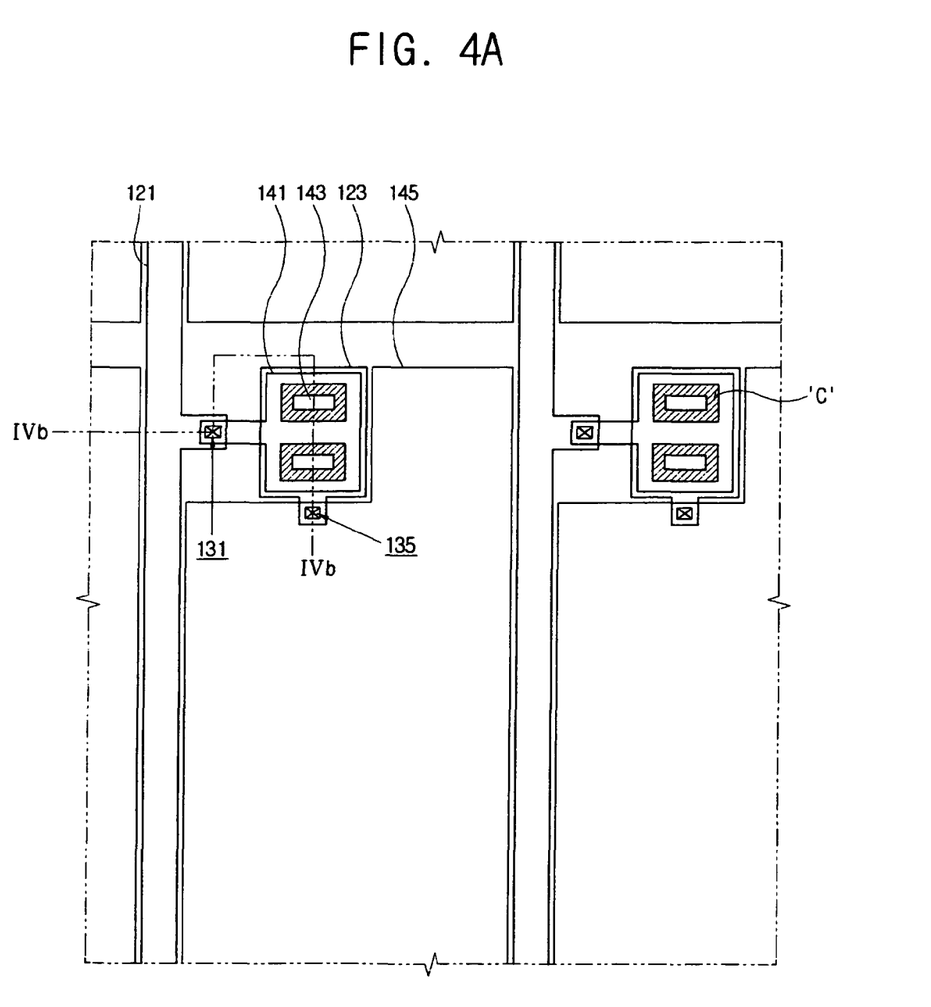
Figure 4B:
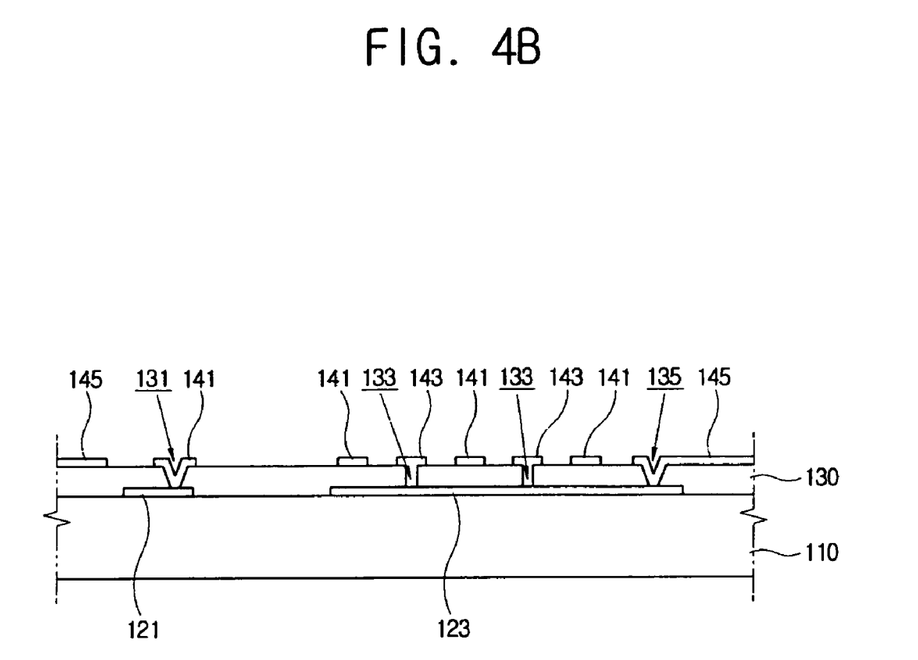

As shown in FIGS. 4a and 4b, intermediate insulating film 130 is formed to cover data conductors 121 and 123, and then, drain electrode 141, source electrode 143 and the pixel electrode 145 are formed on intermediate insulating film 130.

When comprising an organic film, intermediate insulating film 130 may be formed through spin coating or slit coating. When comprising an inorganic film, intermediate insulating film 130 may be formed through a chemical vapor deposition (CVD) or plasma enhanced chemical vapor deposition method (PECVD). Preferably, intermediate insulating film 130 according to the present invention may comprise an organic film having a low dielectric constant to minimize the parasitic capacitance generated between the conductive film 123 and the gate electrode 163. Intermediate insulating film 130 according to the present invention may further comprise an inorganic film as necessary. Intermediate insulating film 130 according to the present invention may comprise 1 to 5 of dielectric constant. A photosensitive organic film, which has a predetermined pattern is formed on intermediate insulating film 130. Then, the drain contact hole 131, the source contact hole 133 and the pixel contact hole 135 which expose parts of data line 121 and the conductive film 123 are formed through an etching process which uses the photosensitive organic film as a blocking film.

Drain electrode 141, source electrode 143 and the pixel electrode 145 are formed as follows. First, a transparent conductive material such as indium tin oxide (ITO) or indium zinc oxide (IZO) is applied to intermediate insulating film 130 through a sputtering method, to form an electrode material layer. Then, the electrode material layer is patterned through photolithography or an etching process, to form at least one source electrode 143 which is connected with the conductive film 123 through the source contact hole 133; drain electrode 141 which is spaced from source electrode 143 and is connected with data line 121 through the drain contact hole 141; and the pixel electrode 145 which forms a part of the pixel region and connected with the conductive film 123 through the pixel contact hole 135. The intermediate area between drain electrode 141 and source electrode 143 comprises the channel area C.

In another embodiment, a metal layer is deposited on intermediate insulating film 130 through a sputtering method. Then, the metal layer is patterned through photolithography to form drain electrode 141 and source electrode 143. Source electrode 143 and drain electrode 141 are separated from each other to define the channel area C. The metal layer may comprise the same metal material as data conductors 121 and 123 and the gate wires 161 and 163. The transparent conductive material such as indium tin oxide (ITO) or indium zinc oxide (IZO) is applied to intermediate insulating film 130 through a sputtering method to form the metal material layer. Then, the metal material layer is patterned to form the pixel electrode 145.

The former method enables to form drain electrode 141, source electrode 143 and the pixel electrode 145 through a single material or process, thereby simplifying a process. When organic semiconductor layer 150 is provided, drain electrode 141 and source electrode 143 which comprise ITO or IZO improve the performance of the thin film transistor compared to source electrode 143 and drain electrode 141 which comprise other metal. In the latter method which employs the semiconductor layer comprising amorphous silicon or poly silicon, the metal material has a larger work function than ITO or IZO, thereby improving the performance of the thin film transistor. However, the strength and weakness of the foregoing processes may be offset through processing conditions and other additional processes. Further, the manufacturing method of drain electrode 141, source electrode 143 and the pixel electrode 145 is not limited to the foregoing methods.

The intermediate area between drain electrode 141 and source electrode 143 comprises the channel area C. The distance between drain electrode 141 and source electrode 143 is the same as the length L of the channel area C. The four internal sides of drain electrode 141 corresponding to source electrode 143 is the same as the width W of the channel area C. Generally, the on-current of the thin film transistor is proportional to the width W/the length L of the channel area C. In the thin film transistor according to the present invention, source electrode 143 is surrounded by drain electrode 141 to increase the width W of the channel area C compared to that of the conventional channel area C which has a straight or J shape. As the on-current value of the thin film transistor increases, the thin film transistor provides better performance. With the foregoing configuration, the size of source electrode 143 decreases compared to the conventional channel area C, thereby lowering the parasitic capacitance which is possibly generated between the gate electrode 163 and source electrode 143, and improving the performance of the thin film transistor.

Figure 5A:
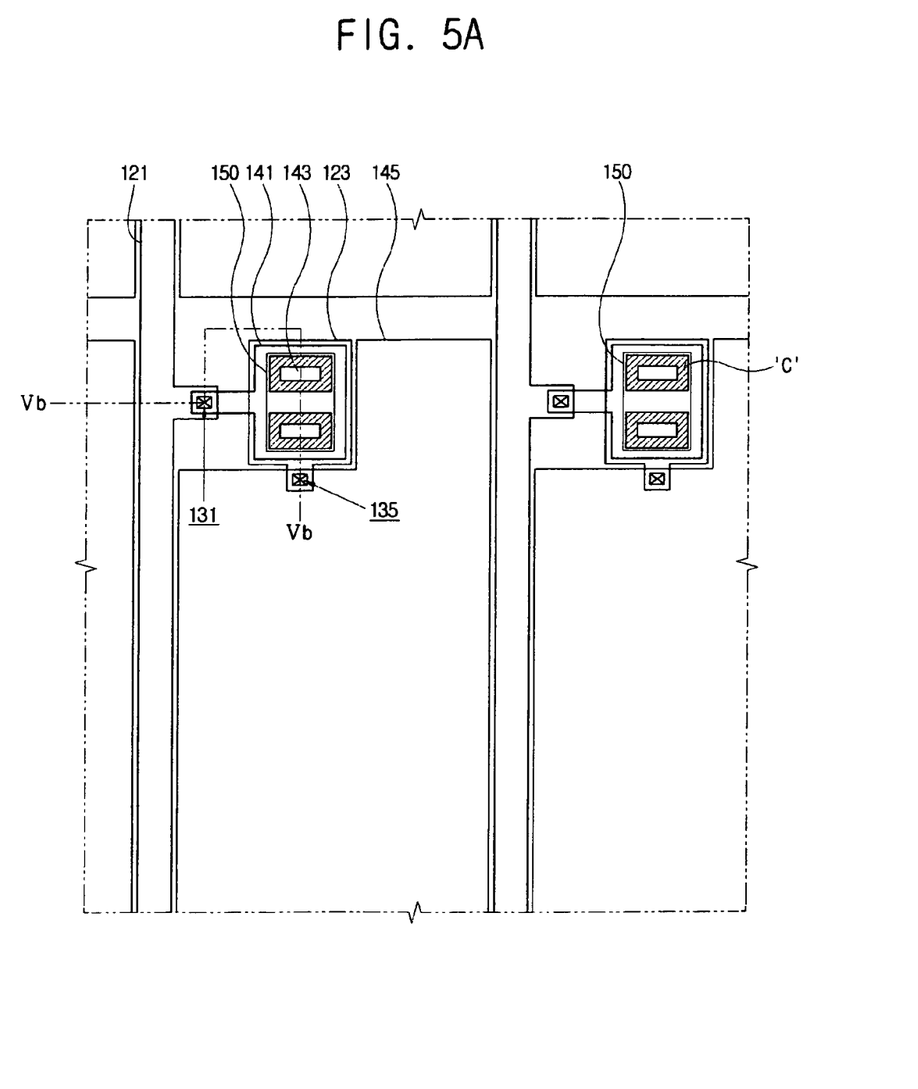
Figure 5B:
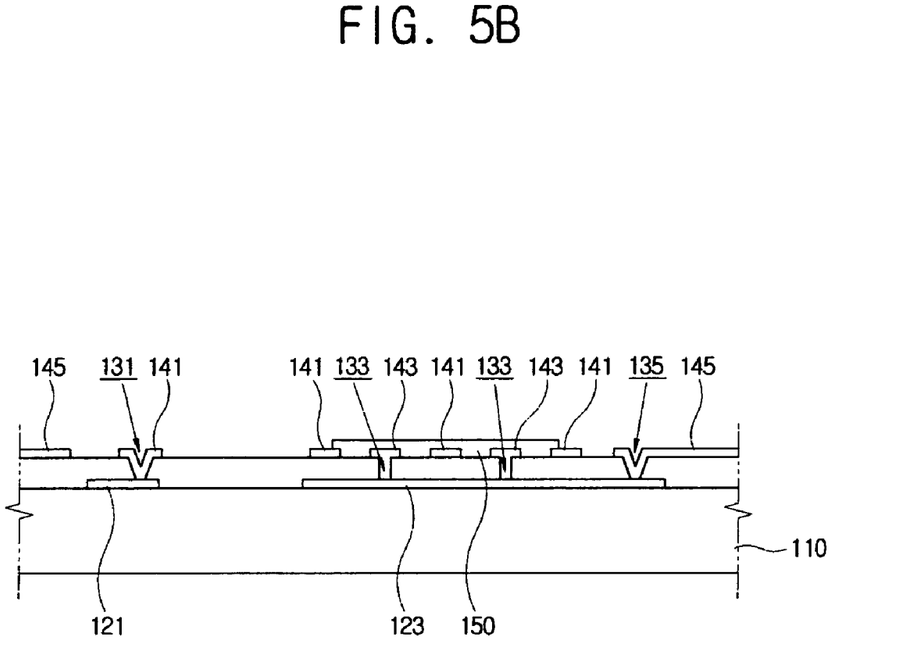

As shown in FIGS. 5a and 5b, organic semiconductor layer 150 is formed on the channel area C through an evaporation method. Alternatively, organic semiconductor solution may be dropped on the channel area C through an inkjet method to form organic semiconductor layer 150. Here, the wall (not shown) may be used to position the dropped organic semiconductor solution in the channel area C. Then, organic semiconductor layer 150 covers the channel area C and partially contacts source electrode 143 and drain electrode 141. The organic semiconductor solution may comprise perylenetetracarboxlic dianhidride (PTCDA) or imide derivative thereof, or naphthalenetetracarboxlic dianhydride (NTCDA) or an imide derivative thereof. Organic semiconductor layer 150 may comprise metalized pthalocyanine or a halogenized derivative thereof, or perylene or coroene and a derivative having a substituent thereof. Preferably, copper, cobalt and zinc may be added to the metalized pthalocyanine. Organic semiconductor layer 150 may comprise co-oligomer or co-polymer of thienylene and vinylene, or thienylene or coroene and a derivative comprising a substituent thereof, or a derivative comprising an aromatic or heteroaromatic ring of the derivatives and one or more hydrocarbon chains having 1 to 30 carbon atoms.

Figure 6A:
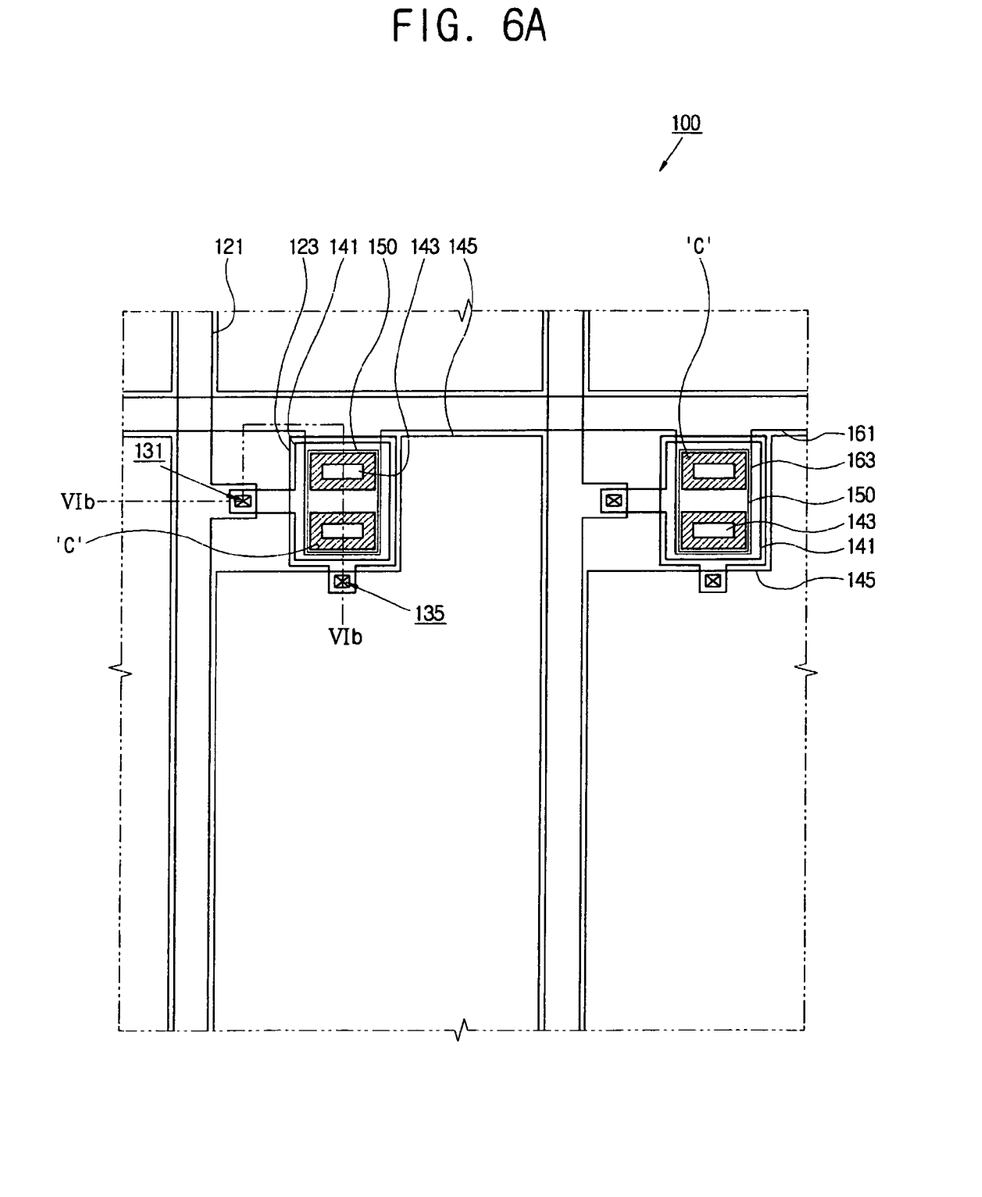
Figure 6B:
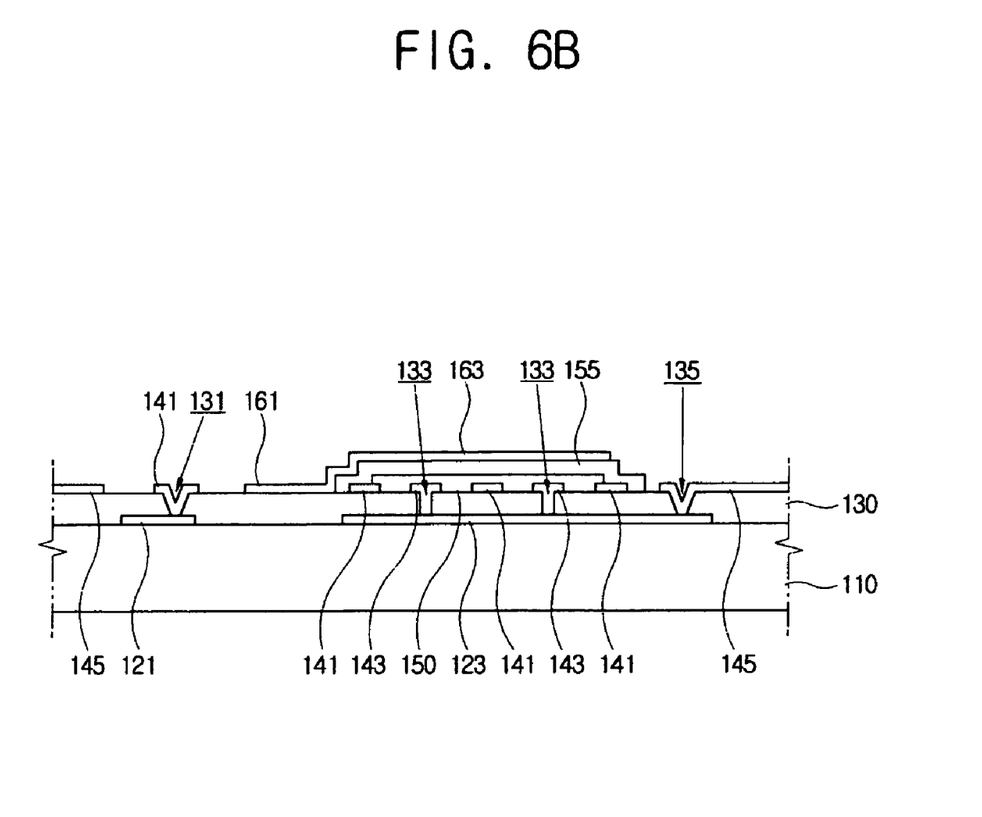

The present invention may be applicable to a semiconductor layer which comprises amorphous silicon or poly silicon, as well as organic material. As shown in FIGS. 6a and 6b, after forming the gate insulating film 155 on organic semiconductor layer 150, the gate wires 161 and 163 comprising gate line 161 perpendicular to data line 121, and the gate electrode 163 being disposed on the gate insulating film 155, are formed.

When the gate insulating film 155 comprises a photosensitive organic film, the gate insulating film 155 may be formed through coating, exposure and development processes. When the gate insulating film 155 comprises an inorganic film having, for example, silicon nitride, the gate insulating film 155 may be formed through deposition and photolithography processes. The gate insulating film 155 prevents organic semiconductor layer 150 from directly contacting the gate electrode 163 and allows organic semiconductor layer 150 to maintain its performance.

The gate wire material layer having metal material is deposited on the gate insulating film 155 through a sputtering method, to form the gate wires 161 and 163. Then, gate line 161 which is perpendicular to data line 121 is formed through photolithography followed by the gate pad (not shown) formed on the end part of gate line 161 and the gate electrode 163 being branched from gate line 161 and disposed on the gate insulating film 155, thereby forming the gate wires 161 and 163. The gate wires 161 and 163 may comprise at least one of Al, Cr, Mo, Nd, Au, Pt and Pd. The gate wires 161 and 163 may comprise a metal single layer or a metal double layer.

Then, the passivation film 170 is formed to cover the gate wires 161 and 163, and drain electrode 141 which is exposed to the outside, to complete the thin film transistor substrate 100.

The present invention may be applicable to a display device such as a liquid crystal display (LCD) device, an organic light emitting diode (OLED) and an electro phoretic indication display. In the embodiment of the present invention, the gate electrode is formed on the semiconductor layer, but not limited thereto. Alternatively, the gate electrode may be formed under the semiconductor layer. Here, an additional component may be provided as the conductive film.

As described above, the present invention provides a display device having an improved thin film transistor, and a manufacturing method thereof.

Although a few embodiments of the present invention have been shown and described, it will be appreciated by those skilled in the art that changes may be made in these embodiments without, however, departing from the spirit and scope of the invention.

What is claimed is:

1. A display device, comprising:
   an insulating substrate;
   a conductive film formed on the insulating substrate;
   a thin film transistor having at least one first electrode electrically connected with the conductive film, a second electrode formed along a circumference of the first electrode and separated from the conductive film, and a semiconductor layer connected with the first electrode and the second electrode; and
   a pixel electrode which is electrically connected with the conductive film.

2. The display device according to claim 1, wherein the second electrode surrounds the first electrode.

3. The display device according to claim 2, wherein the space between the first electrode and the second electrode defines a channel area and the semiconductor layer is formed in the channel area.

4. The display device according to claim 3, further comprising a wall surrounding the channel area and exposing at least a part of the semiconductor layer provided within the wall.

5. The display device according to claim 3, further comprising a gate line and a data line insulatingly crossing each other to define a pixel region, and a gate electrode branched from the gate line and disposed on the semiconductor layer,
   wherein the data line is connected with the second electrode.

6. The display device according to claim 5, wherein the first electrode, the second electrode and the pixel electrode comprise one of indium tin oxide (ITO) and indium zinc oxide (IZO).

7. The display device according to claim 5, wherein an intermediate insulating film is interposed between the conductive film and the first electrode and between the conductive film and the second electrode, the intermediate insulating film having a first contact hole connecting the first electrode and the conductive film and a pixel contact hole connecting the pixel electrode and the conductive film.

8. The display device according to claim 7, wherein a second contact hole is formed in the intermediate insulating film to contact the data line and the second electrode.

9. The display device according to claim 8, wherein dielectric constant of the intermediate insulating film lies in the range of 1 to 5.

10. The display device according to claim 2, wherein the second electrode is has a circular, oval or polygonal loop shape, and the first electrode is provided within the second electrode as an island shape.

11. The display device according to claim 3, wherein the conductive film prevents light from the back of the insulating substrate from supplying to the channel area.

12. A display device, comprising:
an insulating substrate;
a data line which is formed on the insulating substrate;
a second electrode which is electrically connected with the data line;
a first electrode which is spaced from the second electrode and has an island shape surrounded by the second electrode;
a conductive film which is electrically connected with the first electrode and separated from the second electrode;
a semiconductor layer which is electrically connected with the first electrode and the second electrode; and
a pixel electrode which is electrically connected with the conductive film.

13. The display device according to claim 12, wherein the second electrode is provided as a plurality of closed hooks, and the first electrode is provided within each of the second electrodes.

14. The display device according to claim 12, wherein the conductive film is simultaneously formed with the data line and covers an intermediate area between the second electrode and the first electrode.

15. The display device according to claim 1, further comprising an intermediate insulating layer interposed between the conductive film and the source electrode and between the conductive film and the drain electrode, the intermediate insulating film having a pixel contact hole connecting the pixel electrode and the conductive film and a source contact hole connecting the source electrode and the conductive film.

* * * * *